United States Patent
Chiu et al.

(10) Patent No.: US 12,347,712 B2
(45) Date of Patent: Jul. 1, 2025

(54) SUBSTRATE CONTAINER WITH BUILT-IN NEGATIVE PRESSURE CAVITY

(71) Applicant: GUDENG PRECISION INDUSTRIAL CO., LTD., New Taipei (TW)

(72) Inventors: Ming-Chien Chiu, New Taipei (TW); Chia-Ho Chuang, New Taipei (TW); Kuo-Hua Lee, New Taipei (TW); Xin-Yuan Huang, New Taipei (TW); En-Nien Shen, New Taipei (TW); Jyun-Ming Lyu, New Taipei (TW)

(73) Assignee: GUDENG PRECISION INDUSTRIAL CO., LTD., New Taipei (TW)

(*) Notice: Subject to any disclaimer, the term of this patent is extended or adjusted under 35 U.S.C. 154(b) by 141 days.

(21) Appl. No.: 17/992,986

(22) Filed: Nov. 23, 2022

(65) Prior Publication Data
US 2024/0055287 A1 Feb. 15, 2024

Related U.S. Application Data

(60) Provisional application No. 63/397,004, filed on Aug. 11, 2022.

(51) Int. Cl.
*H01L 21/673* (2006.01)
(52) U.S. Cl.
CPC .. *H01L 21/67389* (2013.01); *H01L 21/67386* (2013.01)
(58) Field of Classification Search
CPC .............. H01L 21/67389; H01L 21/67386
USPC ....................................................... 206/710
See application file for complete search history.

(56) References Cited

U.S. PATENT DOCUMENTS

| | | | |
|---|---|---|---|
| 6,199,604 B1 * | 3/2001 | Miyajima | H01L 21/67393 220/240 |
| 8,403,143 B2 * | 3/2013 | Chiu | H01L 21/67353 206/724 |
| 9,091,353 B2 * | 7/2015 | Lo | F16K 15/026 |
| 11,075,099 B2 * | 7/2021 | Ogawa | H01L 21/67389 |
| 2005/0077204 A1 * | 4/2005 | Sumi | H01L 21/67393 206/710 |

(Continued)

FOREIGN PATENT DOCUMENTS

KR 20190122040 A 10/2019
KR 20210062120 A 5/2021

*Primary Examiner* — Steven A. Reynolds
(74) *Attorney, Agent, or Firm* — troutman pepper locke; Tim Tingkang Xia, Esq.

(57) ABSTRACT

The invention discloses a substrate container including a shell and a cover member. The shell defines an accommodation space, and has a bottom and at least one exhaust hole formed on the bottom, wherein the exhaust hole is adjacent to an opening of the shell. The cover member is mounted to the bottom of the shell, and the cover member and the bottom of the shell define a negative pressure cavity above and communicating with the at least one exhaust hole. An elongated exhaust hole is defined above the negative pressure cavity, and communicates with the negative pressure cavity and the accommodation space. A gas in the accommodation space is exhausted sequentially from the elongated exhaust hole, the negative pressure cavity and the at least one exhaust hole.

11 Claims, 9 Drawing Sheets

(56) References Cited

U.S. PATENT DOCUMENTS

2005/0115866 A1\* 6/2005 Burns ............... H01L 21/67369
 206/832

\* cited by examiner

SUBSTRATE CONTAINER WITH BUILT-IN NEGATIVE PRESSURE CAVITY

CROSS-REFERENCE TO RELATED APPLICATION

This application claims priority to and the benefit of U.S. Provisional Patent Application Ser. No. 63/397,004, filed Aug. 11, 2022, which is incorporated herein in its entirety by reference.

BACKGROUND OF THE INVENTION

Field of the Invention

The invention relates to a substrate container, and more particularly to a substrate container having air intake and air exhaust functions.

Description of the Prior Art

Figure 1:
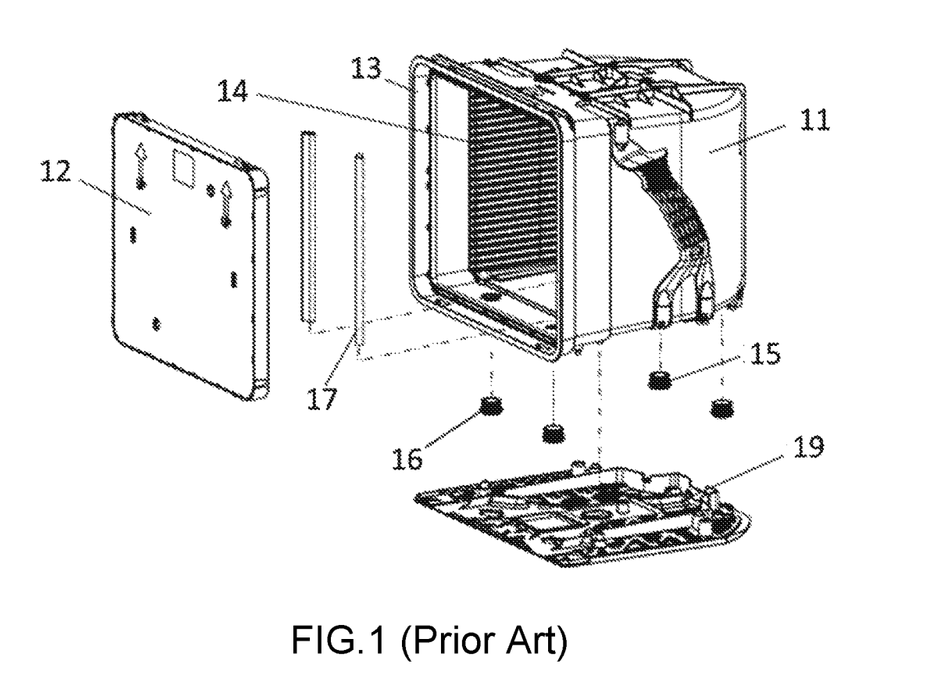
FIG. 1 is an exploded diagram of a conventional substrate container.

FIG. 1 shows an exploded diagram of a conventional substrate container. A conventional substrate container, such as a wafer container, can be a Front Opening Unified Pod (FOUP) or a wafer cassette. The wafer container includes a shell (11) and a door (12). An opening (13) of the shell (11) is coupled with the door (12) to form an accommodation space used to accommodate multiple pieces of wafer or substrates (not shown). A pair of supports (14) are provided on opposite sidewalls in the shell (11) to support edges of the wafer, so that multiple pieces of wafer can be placed in a top-down spaced arrangement. Two intake modules (15) and two exhaust modules (16) are further provided on a bottom of the shell (11), and are assembled in a removable manner to the bottom of the shell (11). The exhaust modules (16) are arranged adjacent to the opening (13), and the intake modules (15) are arranged on a rear of the shell (11). The exhaust modules (16) are capable of exhausting a gas (for example, moisture) in the accommodation space out of the shell (11). The intake modules (15) can admit a dry gas (for example, an inert gas) into the accommodation space. A bottom plate (19) is removably connected to the bottom of the shell (11) to limit the intake modules (15) and the exhaust modules (16), and serves as a bottom support base of the wafer container. Two porous tubes (17) are removably connected to the bottom of the shell (11), and are respectively in fluid communication with the intake modules (15) to uniformly diffuse the dry gas throughout the accommodation space.

Figure 2A:
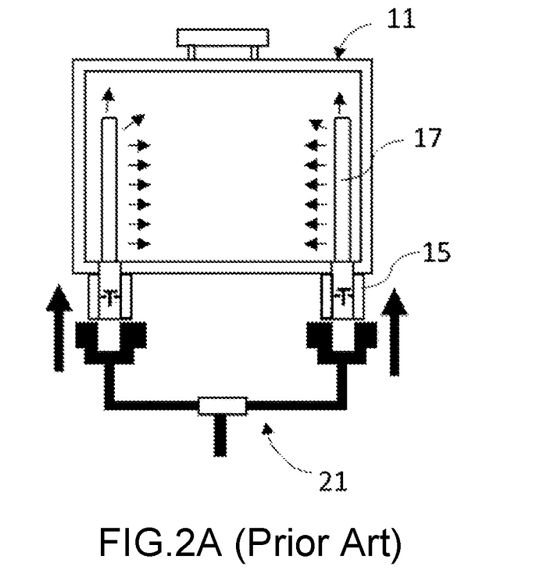
FIG. 2A depicts an air intake operation of a conventional substrate container.
Figure 2B:
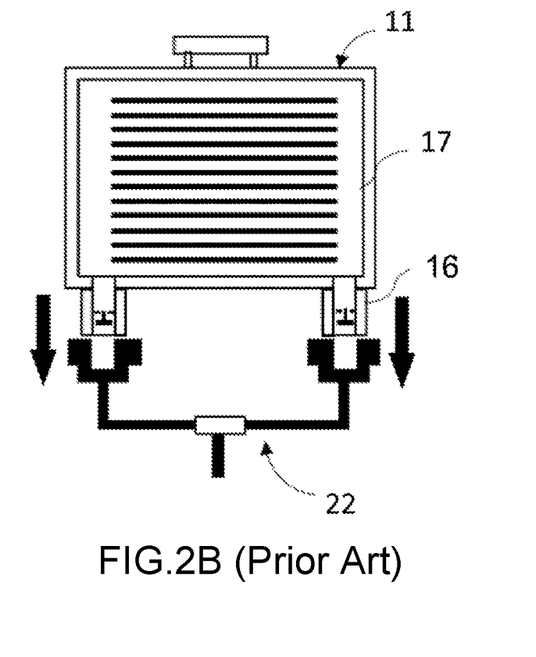
FIG. 2B depicts an air exhaust operation of a conventional substrate container.

FIG. 2A shows filling a gas into a conventional wafer container. When a gas supply device (21) is connected to the intake modules (15), a gas is diffused into the shell (11) through the intake modules (15) and the porous tubes (17). Each of the intake modules (15) has a check valve, which may be configured to open in response to an appropriate air pressure or opened in response to a contact or push. Each porous tube (17) is also referred to as a gas tower, which has multiple minute pores for diffusing a gas in multiple directions into the shell (11), so as to fill the accommodation space with a gas suitable for storing wafer. FIG. 2B shows exhausting a gas from a conventional wafer container. When an exhaust device (22) is connected to the exhaust modules (16), the gas in the accommodation space is exhausted from the exhaust modules (16) on the bottom of the shell (11). Each exhaust module (16) has a check valve, which is in a configuration opposite to that of the check valve of each intake module (15) and opens in response to a pressure of the exhaust device (22). The gas in the accommodation space, for example, moisture, can flow from a top layer of the wafer (W) to a lower layer and be gathered at the bottom of the shell (11) and departs through the two exhaust modules (16).

In semiconductor processes, the door (12) of the wafer container needs to be removed in order to access the wafer in the shell (11). However, a pressure difference may exist between a closed wafer container and a process environment, such that the pressure difference may force external air to enter the shell (11) at the instant of removing the door (12). If the external air carries moisture, the humidity in the accommodation space rises and affects the quality of microstructures on surfaces of the wafer. In general, air exhaustion is also carried out during the removal of the door (12). As shown in FIG. 2B, before rushing deep into the accommodation space, the external air is exhausted through the exhaust module (16) adjacent to the opening (13). However, the conventional exhaust modules (16) are in communication with the accommodation space through only two exhaust holes on the bottom of the shell (11), in a way that pressure distribution of the exhaustion may fail to effectively capture and exhaust downward the external air entering the accommodation space. In addition, the two exhaust modules (16) may have inconsistent exhaust flows.

In view of the above, there is a need for a substrate container, and more particularly, a substrate container capable of improving gas pressure distribution near an opening of a shell during air exhaustion so as to effectively capture an external gas admitted into the accommodation space.

SUMMARY OF THE INVENTION

It is an object of the present invention to provide a substrate container including: a shell, defining at least an accommodation space, and having a bottom and an exhaust hole formed on the bottom, wherein the exhaust hole is adjacent to a door of the shell; a cover member, mounted to the bottom of the shell, the cover member and the bottom of the shell defining a negative pressure cavity above and communicating with the at least one exhaust hole; and an elongated exhaust hole, defined above the negative pressure cavity, and communicating with the negative pressure cavity and the accommodation space. A gas in the accommodation space is exhausted sequentially from the elongated exhaust hole, the negative pressure cavity and the at least one exhaust hole.

In a specific embodiment, at least one exhaust module is configured on the bottom of the shell and communicates with the corresponding exhaust hole to exhaust the gas in the accommodation space.

In a specific embodiment, the cover element is located on a low surface of a step structure on the bottom of the shell, and a top of the cover member is equal to or lower than a high surface of the step structure.

In a specific embodiment, the cover member has a top surface, and the elongated exhaust hole is formed on the top surface.

In a specific embodiment, the cover member has a sloped surface, which faces an opening of the shell and has the elongated exhaust hole formed thereon.

In a specific embodiment, the top of the cover member is parallel to a high surface of a step structure on the bottom of the shell.

In a specific embodiment, the elongated exhaust hole has a width which is less than a diameter of the exhaust hole.

In a specific embodiment, when the accommodation space is vertically placed with multiple pieces of wafer, the negative pressure cavity is located between around the lowermost wafer and the bottom of the shell.

In a specific embodiment, the negative pressure cavity is located between the opening of the shell and a support member of the shell.

In a specific embodiment, the substrate container further includes another elongated exhaust hole defined above the negative pressure cavity. The elongated exhaust holes respectively face a piece of wafer placed in the accommodation space and the opening of the shell.

It is another object of the present invention to provide a substrate container including: a shell, having a front, a back and a bottom, wherein the bottom has at least two air outlets formed adjacent to the front, and has at least two air inlets formed adjacent to the rear; a cover member, mounted to the bottom of the shell to define a negative pressure cavity that crosses over the at least two air outlets; an elongated exhaust hole defined above the negative pressure cavity such that an accommodation space of the shell communicates with the negative pressure cavity via the elongated exhaust hole; and a gas cassette, mounted to the bottom of the shell to define a buffer air chamber that crosses over the at least two air inlets.

BRIEF DESCRIPTION OF THE DRAWINGS

Reference can be made to the drawings and description below to better understand the present invention. Non-limiting and non-exhaustive embodiments are described with reference to the drawings below. It is to be noted that the components in the drawings are not necessarily drawn to their actual sizes, and are depicted to focus on the description on structures and principles.

DETAILED DESCRIPTION OF THE EMBODIMENTS

To better describe the present invention, specific examples and specific embodiments are given with the accompanying drawings below. However, the subject matter of the application may be specifically implemented in various different forms, and the construction covered or asserted by the subject matter of the application is not limited to any exemplary specific embodiments disclosed in the detailed description of the application; it should be understood that the specific embodiments are non-limiting and are not to be construed as restrictive. Similarly, the present invention is to provide a reasonably broad scope for the subject matter applied or covered by the subject matter. In addition, the asserted subject matter may be implemented in form of a method, device or system. Thus, the specific embodiments may be embodied by any combination (non-software known) of such as hardware, software and firmware.

The expression "one embodiment" used in the literature of the application does not necessarily refer to the same specific embodiment, and the expression "other/another (some/certain) embodiments" used in the literature of the application does not necessarily refer to different specific embodiments. The object of the above is, for example, to include a combination of all or part of the exemplary specific embodiments by the subject matter set forth.

Figure 3:
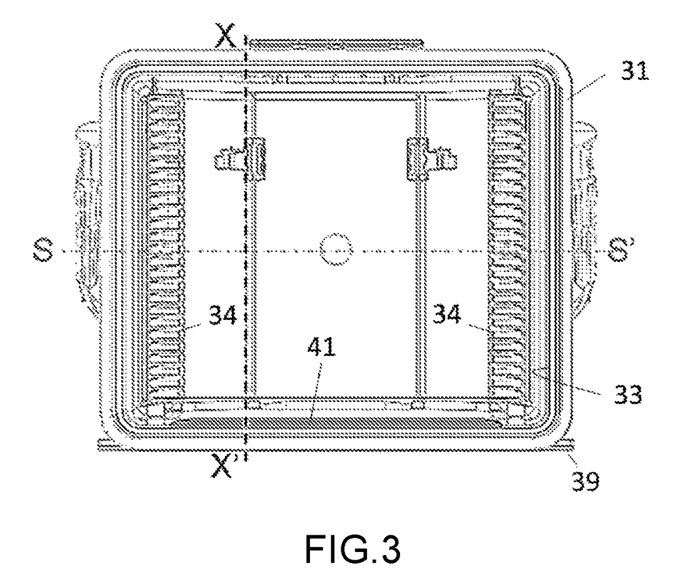
FIG. 3 shows a front view of a substrate container of the present invention, without any door or porous tube.

FIG. 3 shows a front view of a substrate container of the present invention. In this embodiment, a wafer container is taken as an example of the substrate container, which includes a shell (31). The shell (31) is formed primarily by a top, a bottom, a pair of sidewalls, and a rear sidewall, and defines an accommodation space. The top, the bottom and the pair of sidewalls of the shell (31) define an opening (33). Although FIG. 3 does not depict a door or a porous tube of the wafer container, the wafer container may be configured to allow such as the door (12) in FIG. 1 to be removably coupled to the opening (33) to open or close the accommodation space, and also to allow the porous tube (17) shown in FIG. 1 to be mounted to the bottom of the shell (31) and adjacent to the rear sidewall. The assembled porous tube (17) in FIG. 1 extends vertically in the accommodation space, and is capable of supplying a gas in a direction substantially toward the opening (33). The shell (31) includes a pair of support members (34) respectively provided on inner sides of the pair of sidewalls. Each support member (34) fundamentally has multiple tracks or channels allowing peripheries of wafer (not shown) to be inserted therein, and the support members (34) are installed in a vertical direction for placement of multiple pieces of wafer spaced in parallel. A bottom plate (39) is mounted to the bottom of the shell (31), and serves as a bottom support and contact surface of the wafer container. The bottom plate (39) may coordinate with a mechanism of a specific platform to allow such as the gas supply device (21) and the exhaust device (22) in FIG. 2A and FIG. 2B to communicate with an intake module (35) and an exhaust module (36) provided between the shell (31) and the bottom plate (39), as shown in FIG. 4.

Figure 4:
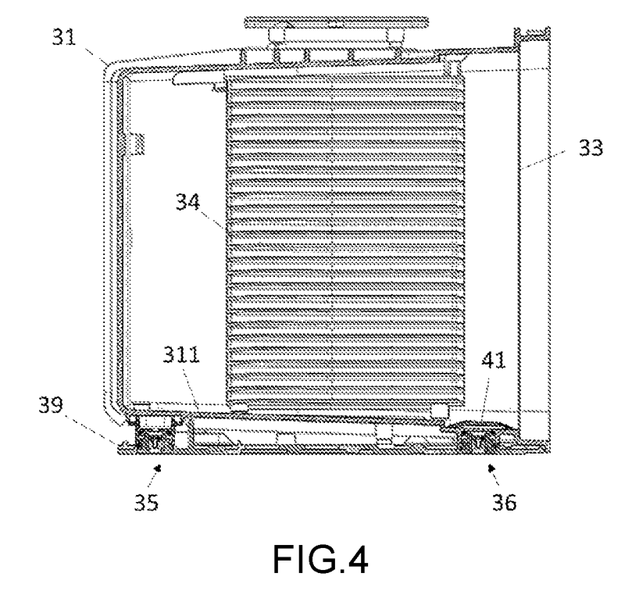
FIG. 4 shows a section structure according to a dotted line X-X' in FIG. 3.

FIG. 4 shows a section structure according to a dotted line X-X' in FIG. 3. The intake module (35) is mounted below the bottom (311) of the shell (31). For example, the intake module (35) shaped as a cylinder may be accommodated in a sleeve extending downward from the shell (31) and be retained by the bottom plate (39). The bottom plate (311) has an air inlet formed corresponding to the intake module (35) to allow a gas to be introduced into the accommodation space from the intake module (35) and be uniformly supplied into the accommodation space through such as the porous tube (17) in FIG. 1. Similarly, the exhaust module (36) is mounted below the bottom (311). For example, the exhaust module (36) shaped as a cylinder may be accommodated in another sleeve extending downward from the shell (31) and be retained by the bottom plate (39). The bottom (311) has exhaust holes formed correspondingly to the exhaust module (36), as shown in subsequent drawings. The exhaust holes allow a gas in the accommodation space to be exhausted from the air exhaust modules (36). Due to a configuration relation between the exhaust module (36) and structures around it, the bottom (311) does not exhibit a horizontal structure, but is a structure that extends slightly downward from the rear sidewall of the shell (31) toward the opening (33); that is, the rear of the bottom (311) is a high end, and the front is a low end. In other different configurations, the bottom (311) may appear horizontal. On the front of the shell (31), that is, close to the end of the opening (33), the bottom (311) includes a step structure.

Referring to FIG. 3 and FIG. 4, a cover member (41) is fixed to the front of the bottom (311) to establish a negative pressure cavity during air exhaustion. The negative pressure cavity is an open space defined by the cover member (41) and the bottom (311), and is located in the accommodation space and communicates with the accommodation space. When the exhaust module (36) communicates with the exhaust device, the pressure of the open space suddenly drops, such that the pressure of the pressure of the open space becomes lower than that of the accommodation space above, that is, the open space forms a negative pressure cavity. It is known according to the position of the cover member (41) in FIG. 3, the negative pressure cavity is substantially located on a bottom side of the opening (23) and extends between the pair of support members (34). It is also known according to the position of the cover member (41) in FIG. 3, the negative pressure cavity is substantially between the opening (33) and the support member (34), and the cover member (41) is installed at a position lower than the position of a bottom of the support member (34).

It is known from the above configuration, the intake module (35) and the exhaust module (36) are first mounted to the bottom (311) and then the bottom plate (39) is assembled to the bottom (311); however, the present invention is not limited to the above configuration. For example, in other possible configurations, the interior of the shell may have a similar configuration, but the bottom plate and the bottom of the shell are coupled to form a base of the substrate container to reserve a space for assembling the intake module and the exhaust module without needing to remove the bottom plate.

Figure 5:
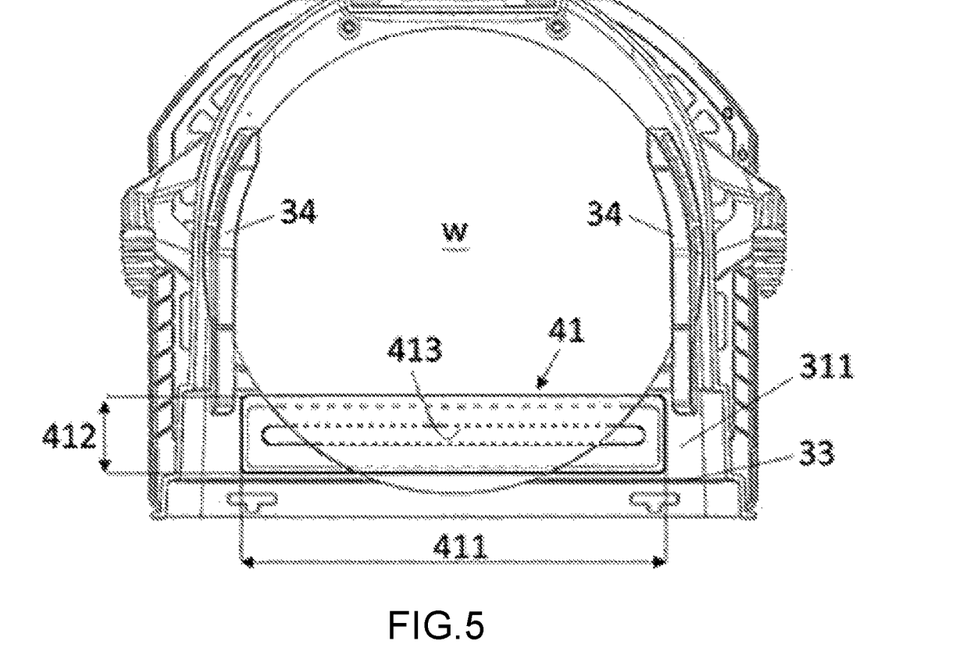
FIG. 5 shows a section structure according to a dotted line S-S' in FIG. 3, with a piece of wafer placed.

FIG. 5 shows a section structure according to a dotted line S-S' in FIG. 3, with a piece of wafer (W) placed. As shown clearly in the drawing, the cover member (41) is fundamentally an elongated shell, and has a length (411) extending between the pair of support members (34) and a width (412) extending between the opening (33) and the support member (34). The length (411) and the width (412) determine a rectangular coverage area of the negative pressure cavity for covering the bottom (311). A top of the cover member (41) defines an elongated exhaust hole (413), which is fundamentally parallel to the length (411); however, the present invention is not limited to the above example. The cover member (41) fundamentally is below the placed wafer (W). Preferably, the cover member (41) and the elongated exhaust hole (413) exceed the coverage range of the wafer (W), so as to ensure that a gas around the wafer (W) can be effectively captured by the negative pressure cavity established in the accommodation space. In other possible embodiments, for example, in an example where the bottom (311) has a sufficient area that can be utilized, the cover member (41) or the elongated exhaust hole (413) may have other shapes to match an airflow mode around the wafer (W).

Figure 6:
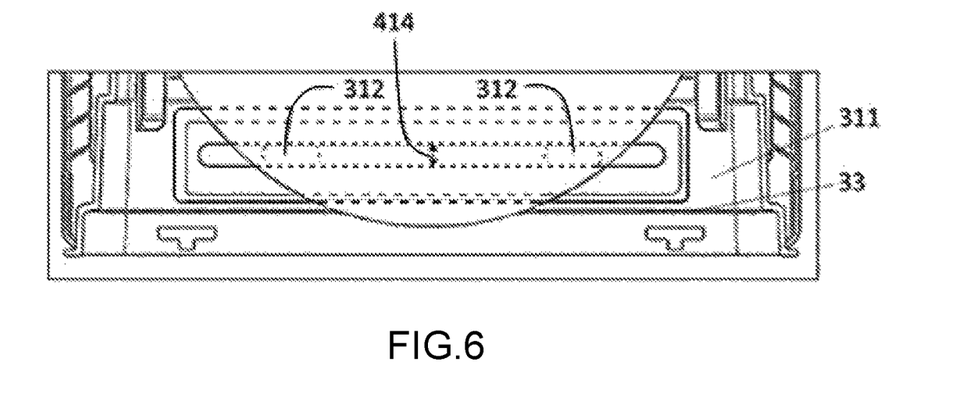
FIG. 6 is an enlarged partial diagram of FIG. 5, and shows a relation between a cover member and two exhaust holes.

FIG. 6 shows an enlarged partial diagram of FIG. 5, and shows a relation between the cover member (41) and two exhaust holes (312). The exhaust holes (312) are holes that pass through the bottom (311) and communicate with the exhaust module (36) in FIG. 4. The exhaust hole (312) and the exhaust module (36) may be in a coaxial or biased relation. The cover member (41) shields two exhaust holes (312), such that the exhaust holes (312) are completely covered in the negative pressure cavity defined by the cover member (41). It should be noted that the present invention does not eliminate a case where the exhaust holes (312) are necessarily covered by the negative pressure cavity. An aperture width (414) of the elongated exhaust hole (413) is fundamentally less than the diameter of the exhaust holes (312). However, the aperture width (414) is preferably not small, otherwise the flow may be reduced and this disfavors the capturing of all the gas around the opening (33).

Figure 7:
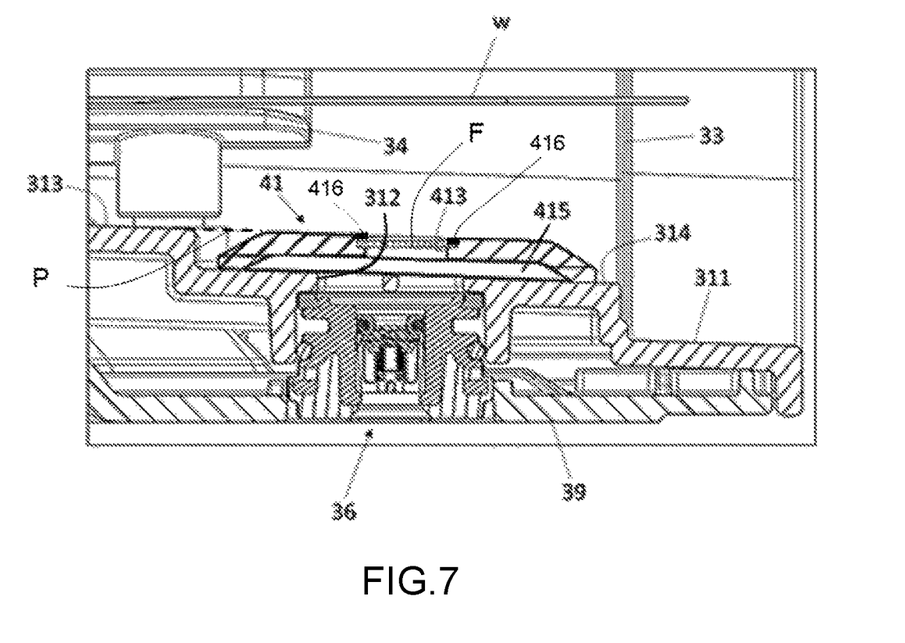
FIG. 7 is an enlarged partial diagram according to FIG. 4, and shows a structural relation of a cover member, a shell and an exhaust module.

FIG. 7 shows an enlarged partial diagram according to FIG. 4, and clearly shows a structural relation of the cover member (41), the bottom (311) of the shell (31) and the exhaust module (36). A front of the bottom (311) is a step structure, which includes a high surface (313) and a low surface (314) that are parallel to each other. The cover member (41) is fixed on the lower surface (314) of the bottom (311), and the cover member (41) and the lower surface (314) define the open negative pressure cavity (415). Although the negative pressure cavity (415) is a flat space, it extends horizontally and covers the exhaust holes (312). Preferably, a top of the cover member (41) is lower than or equal to an extension plane of the high surface (313) of the bottom (311), as shown by the dotted line (P) extending from the high surface (313) to between the high surface (313) and the top, so as to ensure a sufficient space between the lowermost wafer (W) placed at the support members (34) and the cover member (41). When a mechanical arm accesses the wafer container, a front end of the mechanical arm is provided with a sufficient space to extend to below the lowermost wafer for an access operation, without being interfered by the cover member (41).

The negative pressure cavity (415) communicates with the accommodation space through the elongated exhaust hole (413) above, and communicates with the exhaust module (36) through the exhaust holes (312) below, so that the gas in the accommodation space can be exhausted sequentially from the elongated exhaust hole (413), the negative pressure cavity (415) and the exhaust module (36). In the drawings, the elongated exhaust hole (413) and the exhaust holes (312) or the exhaust module (36) may be in a bias relation or a coaxial relation. The elongated exhaust hole (413) may be closer to the front or the rear of the cover member (41) according to capturing requirements. The elongated exhaust hole (413) of this embodiment is configured to face a lower surface of the wafer (W). It should be understood that, the overall exhaust performance on the wafer container may be affected by various sizes, for example, the width and number of the elongated exhaust hole (413), the flat ratio of the negative pressure cavity (415) and the number and diameter of the exhaust holes (312). The flat ratio of the negative pressure cavity (415) may be a height of the cavity divided by a length or a width of the cavity. Alternatively, an additional cover member may be fixed on another surface of the shell (31) and communicate with the exhaust module (36) through an additionally provided path. For example, the additional cover member is located on an inner surface of the pair of sidewalls between the support member (34) and the opening (33), or on the top of the shell (31).

As shown in the drawings, the elongated exhaust hole (413) of this embodiment has a step structure, which is defined by the top surface of the cover member (41) and an annular bearing surface around the elongated exhaust hole (413). A filter element (F) having a shape (as the elongated shape have arcs on two ends shown in FIG. 5) that matches the shape of the elongated exhaust hole (413) may be placed on the annular bearing surface to filter air entering the negative pressure cavity (415). The filter element (F) may be an air permeable membrane and can be replaced. The top surface of the cover member (41) may be provided with one or more stop plates (416) around the elongated exhaust hole (413) to restrain the filter element (F) from departing from the elongated exhaust hole (413). In other considerations, the filter element (F) may be removed in order to increase the flow.

The negative pressure cavity (415) formed above provides advantages. As given in the description associated with the prior art, with only two exhaust holes (312) communicating with the accommodation space, flows may be inconsistent with respect to two exhaust modules (36) corresponding to the exhaust holes (312), resulting in asymmetric pressure distribution of the accommodation space during air exhaustion and hence degraded gas capturing efficiency on either of the sides. The negative pressure cavity (415) provided by the present invention is between the accommodation space and the exhaust holes (312). When the airflow performance of two exhaust modules (36) is inconsistent, the negative pressure cavity (415) enables the gas to uniformly diffuse in the two air exhaust holes (312), thereby achieving a more consistent pressure. Based on the diffusion effect of the negative pressure cavity (415), the elongated exhaust hole (413) enables the two exhaust holes (312) to achieve a substantially consistent pressure, allowing the gas to uniformly pass through the elongated exhaust hole (413) to the two exhaust holes (312) and be exhausted to the exterior.

Figure 8A:
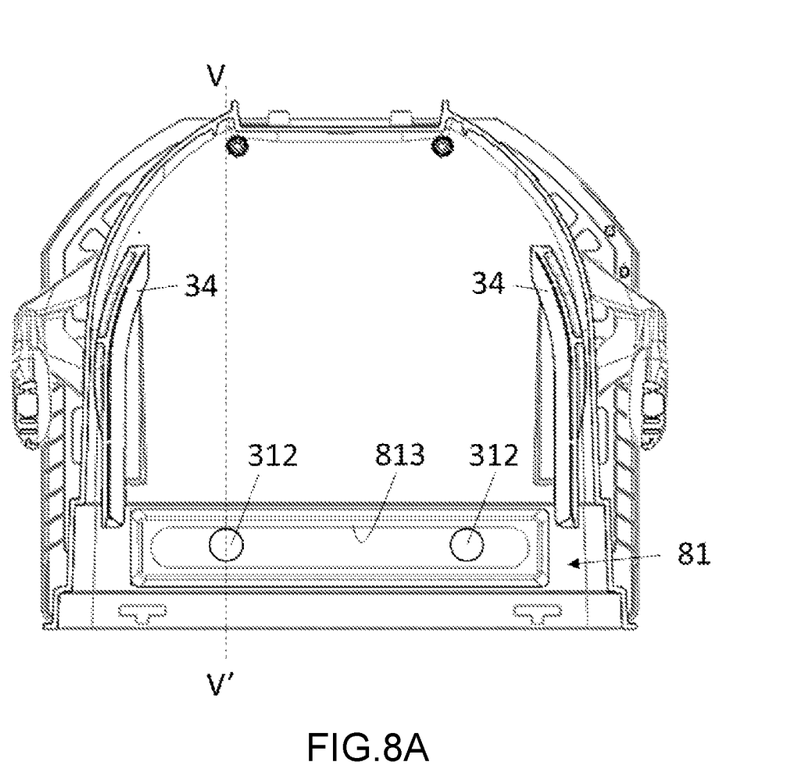
FIG. 8A and FIG. 8B show another variation example of a cover member.
Figure 8B:
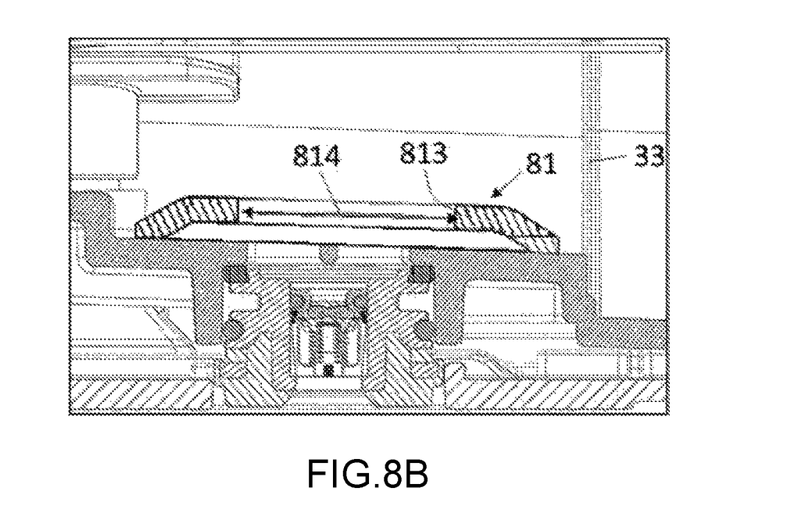

FIG. 8A and FIG. 8B show another variation example of the present invention. A cover member (81) is fundamentally an elongated shell having a length and a width, and defines a rectangular coverage area covering the exhaust holes (312). Compared to the above embodiments, an elongated exhaust hole (813) on a top of the cover member (81) has a greater aperture width (814) to increase a range of a negative pressure cavity for capturing a gas. Although not shown, the elongated exhaust hole (813) may be provided with a filter element as described above.

Figure 9A:
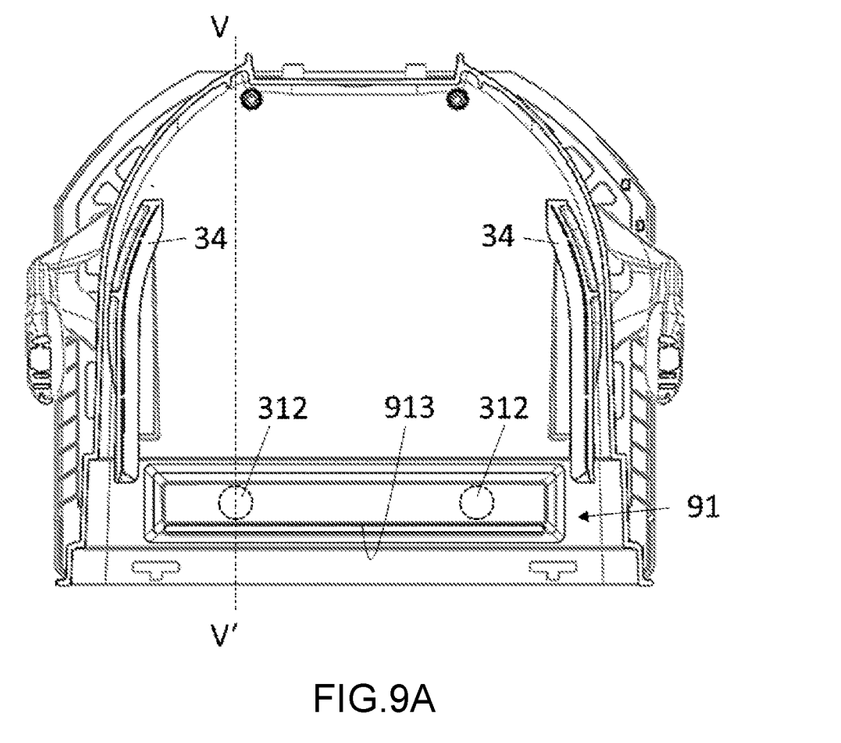
FIG. 9A and FIG. 9B show another variation example of a cover member.
Figure 9B:
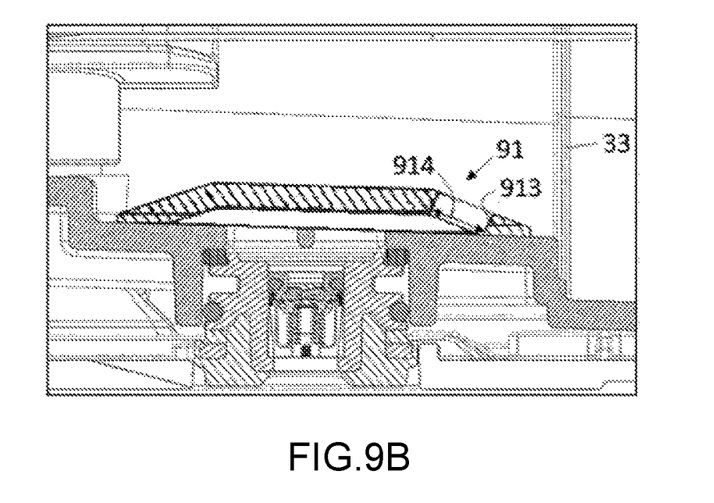

FIG. 9A and FIG. 9B show another variation example of the present invention. A cover member (91) is fundamentally an elongated shell having a length and a width, and defines a rectangular coverage area covering the exhaust holes (312). Compared to the above embodiments, an elongated exhaust hole (913) on a top of the cover member (91) is adjacent to a front and has an aperture width (914). As shown in FIG. 9B, the top of the cover member (91) has a sloped surface that inclines downward toward the front, and the elongated exhaust hole (913) is defined on the sloped surface, such that the elongated exhaust hole (913) faces the opening (33) to more easily capture a gas near the opening (33). Although not shown, the elongated exhaust hole (913) may be provided with a filter element as described above.

Figure 10A:
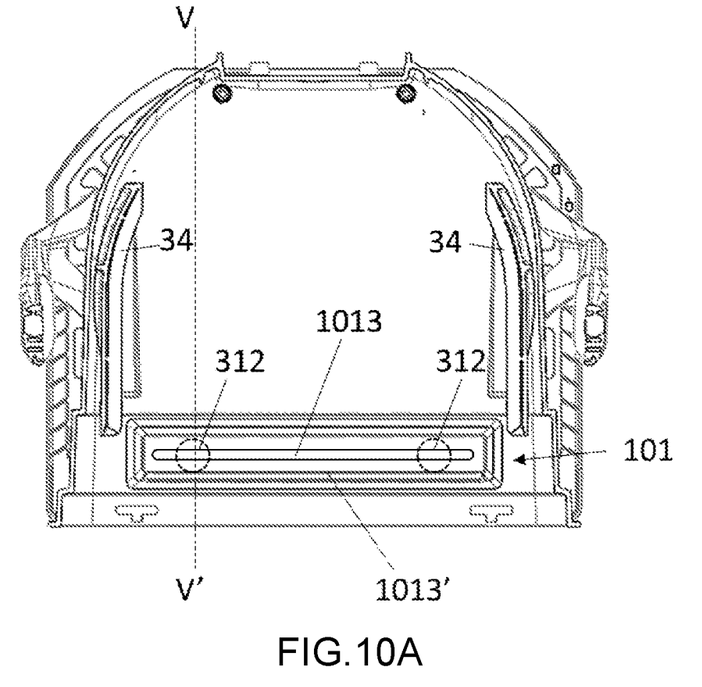
FIG. 10A and FIG. 10B show yet another variation example of a cover member.
Figure 10B:
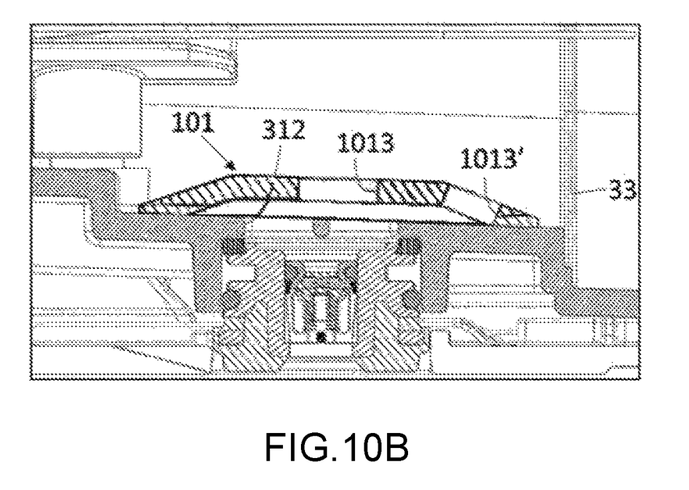

FIG. 10A and FIG. 10B show yet another variation example of the present invention. A cover member (101) is fundamentally an elongated shell having a length and a width, and defines a rectangular coverage area covering the exhaust holes (312). Compared to the above embodiments, a top of a cover member (101) has two elongated exhaust holes (1013, 1013') respectively located on a flat surface and a sloped surface of the top, thereby capturing a gas near a front of the wafer and a gas near the opening (33). Although not shown, the elongated exhaust holes (1013, 1031') may be provided with a filter element as described above.

Figure 11:
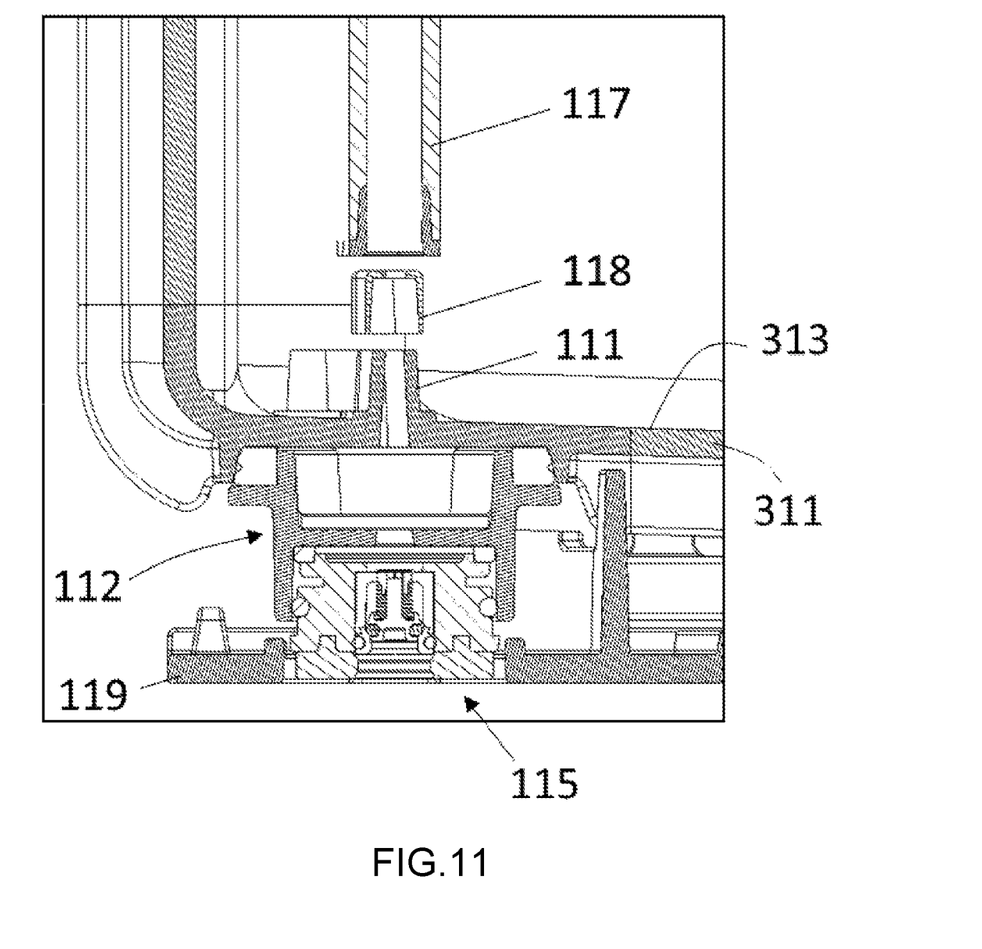
FIG. 11 is a section diagram of a substrate container, and shows an intake module mounted to a bottom of a shell.

FIG. 11 is a section diagram of a substrate container of the present invention, and shows a configuration of a rear of the substrate container. A coupling structure (111) extending upward from the high surface (313) of the bottom (311) is provided in the substrate container. The coupling structure (111) has an air inlet or air inlet passage passing through the bottom (311) of the substrate container. A bottom of the porous tube (117) is sleeved to the coupling structure (111) by a collar (118). A gas cassette (112) is mounted to the bottom (311) of the substrate container, and defines a buffer air chamber that crosses over two coupling structures (111). It should be understood that, the drawings depict only the coupling structure (111) and the intake module (115) on one side. The intake module (115) is installed to a bottom of the gas cassette (112) through the opening of the bottom plate (119), so that the intake module (115) can inject a gas into the buffer air chamber of the gas cassette (112) and then be transported to the porous tube (117) respectively through the coupling structures (111).

The negative pressure cavity disclosed in the above embodiments is defined by the cover member and an upper surface of the bottom of the shell. In other possible embodiments, the negative pressure cavity may be defined by the cover member and a lower surface of the bottom of the shell. Alternatively, the negative pressure cavity may be defined by the structure of the bottom of the shell. However, it should be noted that these possible embodiments are encompassed within the scope of the present invention.

Although certain details are used to describe the present invention as above for better understanding, it is to be understood that certain changes and modifications may be implemented within the scope of protection of the claims. Therefore, the embodiments above are intended for illustration purposes, and are not to be construed as limitations. Moreover, the present invention is not restrained by the details given in the description, and equivalent modifications made be made without departing from the field and spirit of the appended claims.

What is claimed is:

1. A substrate container, comprising:
   a shell, defining an accommodation space, and having a bottom and at least one exhaust hole formed on the bottom, wherein the exhaust hole is adjacent to an opening of the shell;
   a cover member, mounted to the bottom of the shell, the cover member and the bottom of the shell defining a negative pressure cavity above and communicating with the at least one exhaust hole; and
   an elongated exhaust hole, defined above the negative pressure cavity, and communicating with the negative pressure cavity and the accommodation space;
   wherein, a gas in the accommodation space is exhausted sequentially from the elongated exhaust hole, the negative pressure cavity and the at least one exhaust hole.

2. The substrate container according to claim 1, wherein at least one exhaust module is configured on the bottom of the shell and communicates with the corresponding exhaust hole to exhaust the gas in the accommodation space.

3. The substrate container according to claim 1, wherein the cover element is located on a low surface of a step structure on the bottom of the shell, and a top of the cover member is equal to or lower than a high surface of the step structure.

4. The substrate container according to claim 1, wherein the cover member has a top surface, and the elongated exhaust hole is formed on the top surface.

5. The substrate container according to claim 1, wherein the cover member has a sloped surface, which faces an opening of the shell and has the elongated exhaust hole formed thereon.

6. The substrate container according to claim 4, wherein the top surface of the cover member is parallel to a high surface of a step structure of the bottom of the shell.

7. The substrate container according to claim 1, wherein the elongated exhaust hole has a width which is less than a diameter of the exhaust hole.

8. The substrate container according to claim 1, wherein when the accommodation space is vertically placed with a plurality of pieces of wafer, the negative pressure cavity is located between around the lowermost wafer and the bottom of the shell.

9. The substrate container according to claim 1, wherein the negative pressure cavity is located between the opening of the shell and a support member of the shell.

10. The substrate container according to claim 1, further comprising another elongated exhaust hole defined above the negative pressure cavity, wherein the elongated exhaust holes respectively face at least one piece of wafer placed in the accommodation space and the opening of the shell.

11. A substrate container, comprising:
- a shell, defining an accommodation space and having a bottom;
- at least one exhaust module, provided below the bottom of the shell, configured to exhaust a gas in the accommodation space;
- a negative pressure cavity, defined at least by the bottom of the shell, and defined above and communicating with at least one exhaust module; and
- at least one elongated exhaust hole, defined above the negative pressure cavity, and communicating with the negative pressure cavity and the accommodation space;
- wherein, a coverage area of the negative pressure cavity is greater than that of at least one exhaust hole corresponding to the at least one exhaust module.

* * * * *